(12) United States Patent
Brill et al.

(10) Patent No.: US 7,292,335 B2
(45) Date of Patent: Nov. 6, 2007

(54) OPTICAL MEASUREMENTS OF PATTERNED STRUCTURES

(75) Inventors: Boaz Brill, Rehovot (IL); Shachar Gov, Rehovot (IL)

(73) Assignee: Nova Measuring Instruments Ltd., Rehovot (IL)

( * ) Notice: Subject to any disclaimer, the term of this patent is extended or adjusted under 35 U.S.C. 154(b) by 392 days.

(21) Appl. No.: 10/513,035

(22) PCT Filed: Mar. 4, 2003

(86) PCT No.: PCT/IL03/00168

§ 371 (c)(1),
(2), (4) Date: Nov. 1, 2004

(87) PCT Pub. No.: WO03/075042

PCT Pub. Date: Sep. 12, 2003

(65) Prior Publication Data

US 2006/0098195 A1    May 11, 2006

(30) Foreign Application Priority Data

Mar. 4, 2002 (IL) .................................. 148484

(51) Int. Cl.
*G01J 3/427* (2006.01)
(52) U.S. Cl. .................. 356/319; 356/326; 356/310; 356/237.2
(58) Field of Classification Search ............... 356/326, 356/302, 303, 306, 310, 319, 329, 448, 237.2, 356/237.3, 237.4, 237.5, 604, 612, 620–622
See application file for complete search history.

(56) References Cited

U.S. PATENT DOCUMENTS

| 7,158,229 B2* | 1/2007 | Norton et al. ............ 356/326 |
| 2002/0090744 A1* | 7/2002 | Brill et al. ............ 438/11 |
| 2003/0002021 A1* | 1/2003 | Sato ............ 355/67 |
| 2003/0020917 A1* | 1/2003 | Mundt et al. ............ 356/446 |

* cited by examiner

*Primary Examiner*—Gregory J. Toatley, Jr.
*Assistant Examiner*—Abdullahi Nur
(74) *Attorney, Agent, or Firm*—Dekel Patent Ltd.; David Klein (57) ABSTRACT

A method and a system for optical measuring in a structure having a pattern in the form of spaced-apart parallel elongated regions of optical properties different from that of spaces between said regions. The system comprises a broadband illuminator (8) for generating incident radiation, a spectrophotometer arrangement (30) for detecting a spectral response of the structure to the incident radiation, and an optical arrangement (2) for directing the incident light to the structure and collecting the response of the structure, said optical arrangement (2) comprising a numerical aperture (32) selectively limiting the range of at least one of light incidence or collecting angles in direction substantially perpendicular to longitudinal axes of said elongated regions of the pattern.

22 Claims, 4 Drawing Sheets

OPTICAL MEASUREMENTS OF PATTERNED STRUCTURES

FIELD OF THE INVENTION

This invention is in the field of measurement techniques, and relates to optical system and method for accurate measurement parameters of regular patterned structures. The invention is particularly useful for controlling semiconductor manufacturing process.

BACKGROUND OF THE INVENTION

Lithography is widely used in various industrial applications, including the manufacture of integrated circuits, flat panel displays, micro-electro-mechanical systems, micro-optical systems etc. Generally speaking, the lithography process is used for producing a patterned structure. During the manufacture of integrated circuits, a semiconductor wafer undergoes a sequence of lithography-etching steps to produce a plurality of spaced-apart stacks, each formed by a plurality of different layers having different optical properties. Each lithography procedure applied to the wafer results in the pattern on the uppermost layer formed by a plurality of spaced-apart photoresist regions.

To assure the performance of the manufactured products, the applications of the kind specified above require an accurate control of the dimensions of sub-micron features of the obtained pattern When dealing with wafers, the most frequently used dimensions are the layer thickness and the so-called "critical dimension" (CD). CD is the smallest transverse dimension of the developed photoresist, usually the thickness of the finest lines and spaces between these lines. Since the topography of the measured features is rarely an ideal square, additional information found in the height profile, such as slopes, curves etc., may also be valuable in order to improve the control of the fabrication process.

Several Optical CD (OCD) measurement techniques recently developed rely on imaging a certain test pattern in the form of diffraction gratings, which are placed in a special test area of the wafer. The gratings are illuminated by light (typically a laser beam), and the resulting diffraction pattern is analyzed to determine the line width and profile of the gratings. These techniques utilize various methods aimed at amplifying tiny differences in the line-width to obtain macroscopic effects that could be resolved by visible light, although the original differences are more than two orders of magnitude below the wavelength used.

Techniques of the other kind utilize scatterometric measurements, i.e., measurements of the spectral characteristics of a sample. To this end, when dealing with wafers, a test pattern in the form of a grating is placed in the scribe line between the chips. The measurement includes illumination of the grating with a beam of incident light and determining the diffraction efficiency of the grating under various conditions. The diffraction efficiency is a complicated function of a line profile and of the measurement conditions, such as the light wavelength angle of incidence, polarization and diffraction order of collected light, thus providing a wealth of data allowing the extraction of information about the line profile.

Techniques that utilize the principles of scatterometry and are aimed at the characterization of three-dimensional grating structures and determination of line profiles have been disclosed, for example, in the U.S. Pat. Nos. 5,867,276 and 5,963,329. Broadband scatterometry consists of the illumination of a sample with an incident light beam having a broad spectral composition and detecting a beam of light diffracted from the sample with a spectrometer to obtain spectrally-resolved diffraction characteristics of the sample for determining the parameters of the sample.

However, in the above patent, these documents do not describe any specific method of measurements, or the constructional and operational principles of specific adjustment or optimization of numerical aperture for illumination/detection optical systems.

SUMMARY OF THE INVENTION

It is accordingly a need in the art to improve the optical measurements on patterned structures by providing a novel method and system for measurements in a sub-micron patterned structure to determine parameters of the structure utilizing the principles of scatterometry.

It is a still further feature of the present invention to provide a system whose operation is fast enough, so that every wafer in the production line can be measured, allowing a closer control over the process.

It is a still further feature of the present invention to provide such a system, which enables an adjustable per application measurement procedure, thereby decrease the calculation session without affecting the quality of the entire measurement.

The main idea of the present invention is based on the following. The measurement process is based on the detection of spectral characteristics of light diffracted from a patterned structure (e.g. line array or grid), and the determination of desired parameters of the structure based on these characteristics. Diffraction characteristic are well known to depend on the incidence angle (3-Dimensional). Two main cases should be discussed: (a) when the plane of incidence (a plane including both the incident beam and the normal to the surface) is parallel to the grid lines, and (b) when the plane of incidence is perpendicular to the grid lines. It is also a general fact that the dependence of the diffraction characteristics on the incidence angle is smaller in case (a) than in case (b). When measuring the diffraction signature using a real physical measurement system the signature is always an average over some finite range of incidence angles, determined by the Numerical Aperture (NA) of the measuring system. When attempting to interpret such a measurement using a rigorous model the incidence angle range is a source of error, since the basic model is calculated for a unique incidence angle. It is however impossible to reduce the NA without limit since the amount of collected signal per unit time, determining the practical signal to noise ratio (SNR), decreases with decreasing NA. It is therefore required to find an optimum NA, taking into account both the requirement for a good SNR and the requirement that the diffraction characteristics do not change significantly within the used incidence angle range. When using a large, symmetrical (e.g. round) NA, it is clear, following the above discussion, that the off-axis components of type (b) are the major source of error. It is therefore suggested in this invention to selectively limit the range of incidence angles along the direction perpendicular to the grid lines, keeping the range of incidence angles in the parallel direction as large as possible in order to preserve the total signal and hence the SNR.

Thus, in accordance with one broad aspect of the present invention there provided is an optical measurement system for measuring in a structure having a pattern in the form of spaced-apart parallel elongated regions of optical properties different from that of spaces between said regions, the system comprising a broadband illuminator for generating incident radiation, a spectrophotometer arrangement for detecting a spectral response of the structure to the incident radiation, and an optical arrangement for directing the incident light to the structure and collecting the response of the structure. The optical arrangement comprises a numerical aperture selectively limiting the range of at least one of light incidence or collecting angles in direction substantially perpendicular to longitudinal axes of said elongated regions of the pattern.

A metrology system for performing the measurements using this invention would therefore include a non-circular aperture (e.g. slit-like, elongated), placed in such a location along the optical axis that the range of incidence angles of the light impingent of the sample is non-symmetrical. In accordance with one embodiment of the present invention, such an aperture may be placed between the objective lens and the image plane. Alternatively the aperture may be placed in the back focal point of the objective lens or in an optically equivalent location as shown below.

The aperture is non-circular, providing imaging and/or illuminating of the structure with NA different in two orthogonal directions corresponding to the grid layout. The NA is relatively large along the lines of the grid and relatively small in direction, perpendicular to the lines.

According to another aspect of the current invention the NA is adjustable according to the application. Adjusting the NA is done using the simulated sensitivity of the spectrum to the incidence angle. Accordingly, the measurement system includes variable aperture(s), allowing the selection between several NA configurations. The best embodiment of such a variable NA mechanism would include two perpendicular slit apertures, where each can be either in the optical path or outside the optical path. By selecting which slits are in the system can select among 4 different NA on figurations to be chosen according to the application and the grating direction. It is further possible to use variable width slits, increasing the number of possible NA configurations. An alternative aperture design that will also support selection of NA per application is a variable circular aperture, that can be realized either as a continuous mechanism (iris) or as a set of fixed apertures that are being replaced by some mechanism.

The patterned structure comprises a plurality of spaced-apart stacks, each including different layers having different optical properties, the pattern being formed by spaced-apart regions of an uppermost layer. The determination of the desired parameters utilizes a certain optical model based on some features of a patterned structure of the kind specified, and presents the dependence between various parameters of the structure and the spectral characteristics of light returned from such a structure.

There is thus provided according to one aspect of the present invention, a measurement system for determining a profile of a patterned structure comprising a plurality of spaced-apart stacks, each including different layers having different optical properties, wherein the pattern is formed by spaced-apart regions of an uppermost layer, the system comprising an optical measurement channels, including an illumination assembly and a collection-detection assembly, and a control unit coupled to output of the first and second collection-detection assemblies, wherein: p0 the illumination assembly produces incident light of substantially broad wavelengths band normally directed onto the structure, and the collection-detection assembly detects spectral characteristics of light specularly reflected from the structure and generates measured data representative thereof, said control unit is capable of analyzing the measured data generated by the collection-detection assembly for determining at least one parameter of the structure, and utilizing said at least one parameter for determining the profile of the structure, wherein the illumination and/or collection-detection assembly includes non-circular numerical aperture providing different solid angles of illuminating and/or collected light-beam-relative to the structure.

According to another broad aspect of the present invention, there is provided a method for measuring in a structure having a pattern in the form of spaced-apart parallel elongated regions of optical properties different from that of spaces between said regions, the method comprising illuminating the structure with incident radiation and detecting a spectral response of the structure, wherein at least one of incident radiation propagating towards the structure and the radiation response propagating from the structure passes through numerical aperture selectively limiting the range of at least one of light incidence or collecting angles in direction substantially perpendicular to longitudinal axes of said elongated regions of the pattern.

In other words, there is provided method for measuring in a patterned structure to determine a profile of the structure, wherein the structure comprises a plurality of spaced-apart stacks, each including different layers having different optical properties, the pattern being formed by spaced-apart regions of an uppermost layer, the method comprising the steps of:

illuminating the structure by a broad wavelengths band of incident light normally directed on said structure, detecting spectral characteristics of light specularly reflected from the structure and generating measured data representative thereof, analyzing said measured data and determining at least one parameter of the structure and utilizing said at least one parameter for determining the profile of the structure, wherein said illuminating and/or detecting is performed using different values of numerical apertures along and perpendicularly to said structure lines.

More specifically, the present invention is used for controlling a lithography process used in the manufacture of semiconductor devices (wafers), and is therefore described below with respect to this application.

Preferably, the spectrophotometer is provided with an aperture stop accommodated in the optical path of the specular reflected light component. The diameter and shape of the aperture stop is set automatically according to the direction of the grid of the measured structure and according to the sensitivity of the specific application to the angle of incidence.

BRIEF DESCRIPTION OF THE DRAWINGS

In order to understand the invention and to see how it may be carried out in practice, a preferred embodiment will now be described, by way of non-limiting example only, with reference to the accompanying drawings, in which.

DETAILED DESCRIPTION OF A PREFERRED EMBODIMENT

Figure 1:
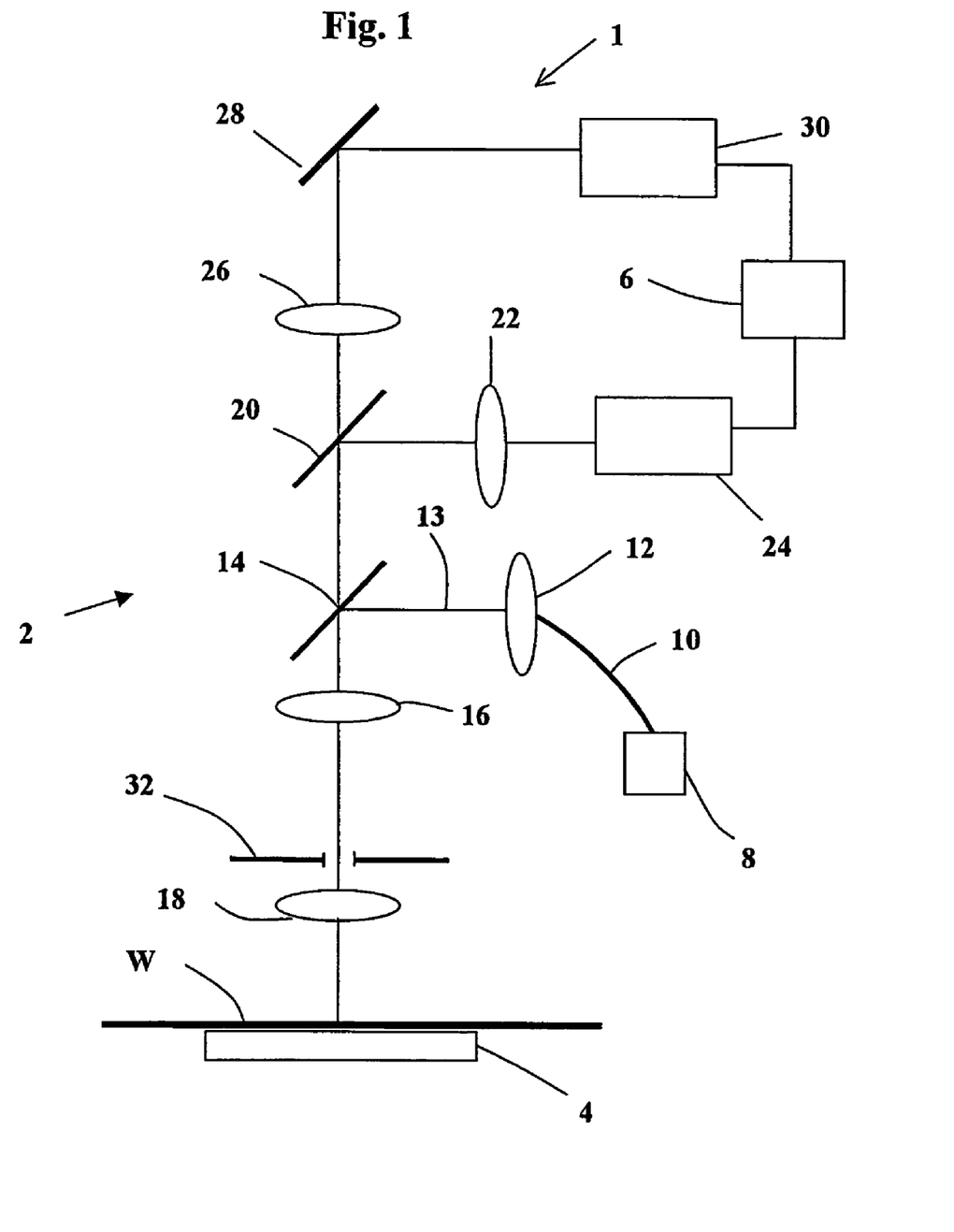
FIG. 1 is a schematic illustration of the main components of a measurement system constructed according to one embodiment of the invention.

Referring to FIG. 1, there is illustrated a measurement system 1 constructed and operated according to the invention for measuring parameters of a wafer W (constituting a patterned structure). The system 1 may represent one of the working stations of a semiconductors' production tool or line (not shown), the wafers W progressing between upstream and downstream stations of the production line. The system 1 includes a measurement unit 2, a support stage 4 for supporting the wafer W and a control unit 6. Also provided in the system 1, is a wafer handler, which is not specifically shown The wafer handler serves for loading/ unloading wafers to and from the stage 4, and may include a suction means for holding the wafer. Generally speaking, the wafer handler and wafer stage serve together for receiving wafers from a processing tool (not shown here) and returning them to the same or another processing tool and optionally for aligning them along coordinate axes (eg.,by rotating the handler), maintaining, placing in a measuring position, etc.

As schematically illustrated in FIG. 1, an optical path of measurement unit 2 comprises a broad-band (white) light source 8, for example a Xenon arc lamp, an optional optic fiber 10, a condenser 12, which directs the light beam 13 onto a beam splitter 14, a relay lens 16, and a translatable objective lens 18. Behind the beam splitter 14 are located a pinhole mirror 20, a relay lens 22 and a pixel-array detectors (e.g., CCD) 24. Behind the pinhole mirror 20 there are: another relay lens 26, a mirror 28 and a spectrophotometer 30. In order to perform measurements over entire surface of the wafer W, the only the objective lens 18 may be translated, parallel to the plane of the surface of the wafer W, typically along with some mirrors which are not functional parts of the optical path, e.g. as disclosed in U.S. Pat. No. 5,517,312 assigned to the assignee of the present application. An aperture stop 32 is accommodated in the optical path of the system between the objective lens 18 and the image plane adapted to set the effective numerical aperture of the measurement unit 2. Preferably, the aperture 32 has a non-circular (e.g. slit-like) form, providing different values of effective numerical aperture NA in two orthogonal directions corresponding to the wafer's W layout. The pixel-array detectors (e.g., CCD) 24 along with appropriate hardware and/or software form an imaging utility, determining the location of measurement sites and the orientation of pattern elements.

The aperture 32 may be also provided with and coupled to and operated by appropriate drive-units (not shown) in order to individually adjust the effective numerical aperture in two orthogonal directions.

Figure 3:
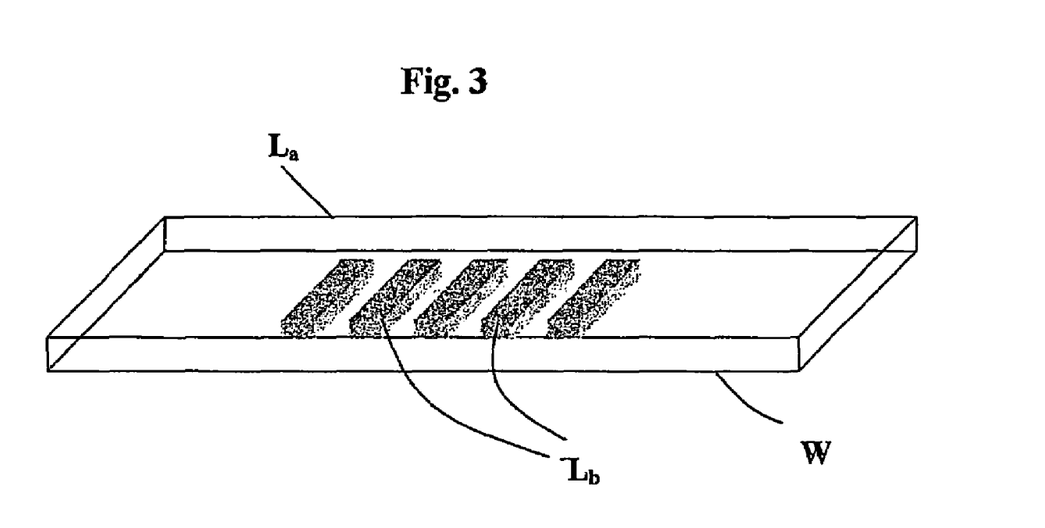
FIG. 3 is a schematic illustration of a wafer structure.

As schematically illustrated in FIG. 3 (not in a correct scale), the wafer W typically has a plurality of stacks formed by different layers, and presents a structure with a periodic pattern. The measurements are aimed at determining the profile of the pattern lines, namely formed by it's the uppermost (photoresist in the present example) layer $L_a$, either prior to or after the etching procedure applied to the wafer. The uppermost layer $L_a$ has a pattern formed by spaced-apart regions $L_b$ of developed photoresist (in the case of prior-to-etching situation). Usually, the smallest transverse dimension of the developed photoresist is called the "critical dimension" (CD), however other definition of the CD may be also applied. The CD of the developed photoresist determines the CD of the entire wafer (i.e., patterned structure).

The parameters of the profile of the pattern lines to be determined may include the following:

height of the profile (i.e., the thickness of the photoresist);
critical dimensions at the bottom and top of the photoresist region, respectively;
radius of the curvatures at the bottom and top of the photoresist region, respectively; and
the period of grating.

The above is the example of a symmetrical line profile. In the case of an asymmetrical profile, a so-called "tilt" should also be determined.

Turning back to FIG. 1, the measurement unit 2 includes such main constructional parts as illumination and collection-detection assemblies.

Figure 4A:
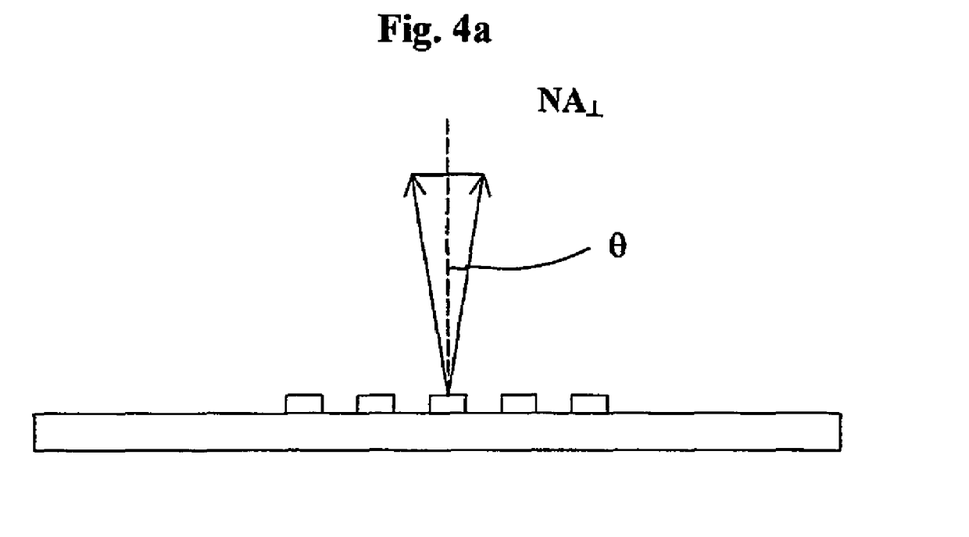
FIG. 4 exemplifies the angles of light propagation within different ranges along different axis.
Figure 4B:
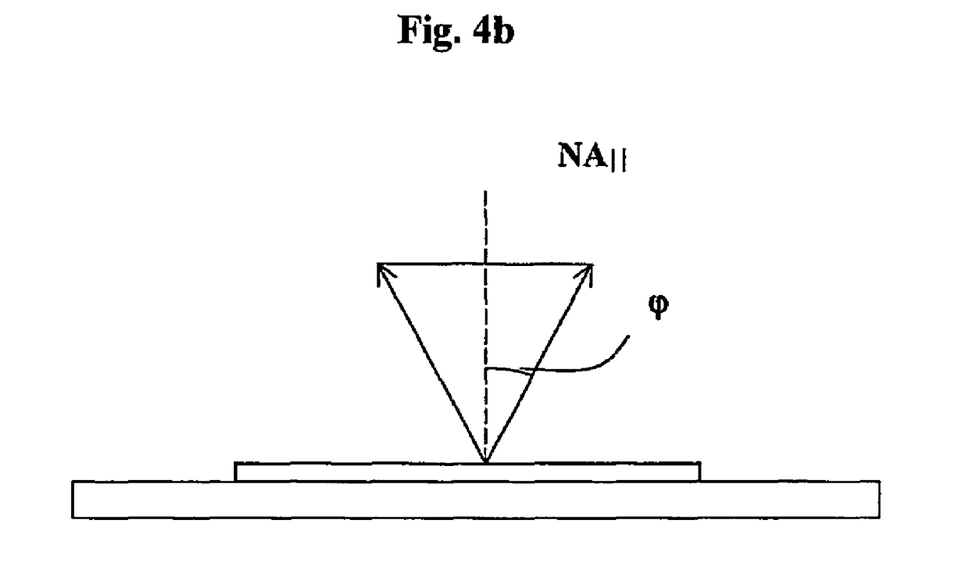

The illumination assembly is mainly composed of the light source 8, the beam splitter 14 and the objective and relay lenses 16 and 18 that are driven by a suitable driver (not shown) for auto-focusing purposes. The light source 8 generates incident light 13 of a broad wavelength band. The beam splitter 14 serves for spatially separating incident and returned light components. The aperture 32, of a non-circular form, providing different values of effective numerical aperture NA of the apparatus in two orthogonal directions corresponding to the wafer's W layout. Here, a rectangular or slit-like aperture, such as exemplified in FIGS. 4a and 4b provides the angles of light propagation within different ranges along its axis. Preferably, the $NA_\parallel$ along grid lines is about 0.2 and the $NA_\perp$ in direction perpendicular to the grid lines has been reduced to 0.05 and even less. To this end, the light component along the grid lines propagates within a solid angle $\phi$ of about 20° (i.e., within a range of about ±10 from the normal) and light component perpendicular to the grid lines propagates within a solid angle $\theta$ about 10° in the present example. In this case, the intensity of illuminating light is reduced by factor 4 and is still sufficient for performing measurement with desired speed due to integration time of the pixel-array detectors 24 and spectrophotometer 30. It should be noted, that simple reduction of the numerical aperture from 0.2 to 0.05 will case decreasing intensity of illuminating light by factor 16, which may be un-sufficient for performing high speed measurements.

The collection-detection assembly also includes a spectrophotometric detector 30 and a beam splitter 20 in the form of a pinhole mirror, the purpose of which will be explained further below. The incident light 13 normally impinges onto the wafer W, and light specularly reflected (normal "0" order) is collected and directed towards the detector 30, in a manner described further below.

It should be noted, although not specifically shown, that optical fibers may be used for directing light components ensuing from the pinhole mirror 20 to the detector 30.

Hence, the detectors could be mounted at any suitable location Additionally, a suitable drive assembly may be is provided for rotating or/and moving the stage 4 within the X-Y plane or/and moving the respective optical elements, thereby enabling the measurements at different locations on the wafer. The system 1 could be provided with a dynamic auto-focusing assembly enabling high-speed measurements.

The construction and operation of a measurement system including the zero order detection spectrophotometer (measurement channel 2 ) and the imaging channel 26 is disclosed in U.S. Pat. No. 6,045,433 assigned to the assignee of the present application. This document is therefore incorporated herein by reference with respect to this specific example.

The pinhole mirror 20 separates a central part (about 20 µm) of light specularly reflected from the illuminated spot and collected by the lens 18, and allows its propagation towards the spectrophotometric detector 30. A periphery part of light beam is reflected from the mirror 20 towards the imaging detector 24. As a result a measurement area, considered in the spectrophotometric detector 30, presents a 20 µm "dark" central region in a 1 mm×1 mm quadrant of the field of view of CCD. This approach enables to locate the measurement area in the entire illuminated spot defined by the field of view of the CCD.

The outputs of the spectrophotometric detector 30 and the imaging detector 24 are coupled to the control unit 5. The control unit 5 it typically a computer device having a memory for storing reference data (libraries), one or more processor for analyzing data coming from the detectors and controlling all the operations of the measurement system 1 including driver(s), light sources, power supply, interface, etc. The control unit 5 also displays the measurement results. The processor is operated by suitable image processing and pattern recognition software, capable of both global and site-to-site alignment The alignment technique based on the features of the pattern is disclosed in U.S. Pat. Nos. 5,682,242 and 5,867,590, both assigned to the assignee of the present application.

Thus, the control unit 5 is capable of locating and processing measurements. The analysis of the measured data could be used for establishing feedback closed-loop control of a corresponding processing tool, as will be described further below.

The measurement system according to the invention is designed so as to allow integrated optical measurement of CDs as well as other parameters of the wafer's profile. The operation of the system is based on the measurement of the diffraction efficiency spectrum from the grating on the wafer. The grating is any periodic structure composed of features whose parameters should be measured, e.g. minimal linewidth, through holes, etc. Due to the periodic structure, the diffraction from the features on the wafer is limited to a discrete number of angles (diffraction orders), as governed by the diffraction equation:

$$\sin\Theta_r = \sin\Theta_i + n\frac{\lambda}{d}$$

where $\Theta_i$ is the incidence angle, $\Theta_r$ is the reflected angle, $\lambda$ is the wavelength, d is the grating period and n is the order number (n=0 being the specular reflection).

It should be noted that the measured gratings could be either an integral part of the operative portion of the wafer ("patterned area"), or a test-pattern located in the non-operative portion ("margin area") of the wafer. Such small test structures which are typically smaller than 40 µm×40 µm are measured using a focusing lens.

Figure 2:
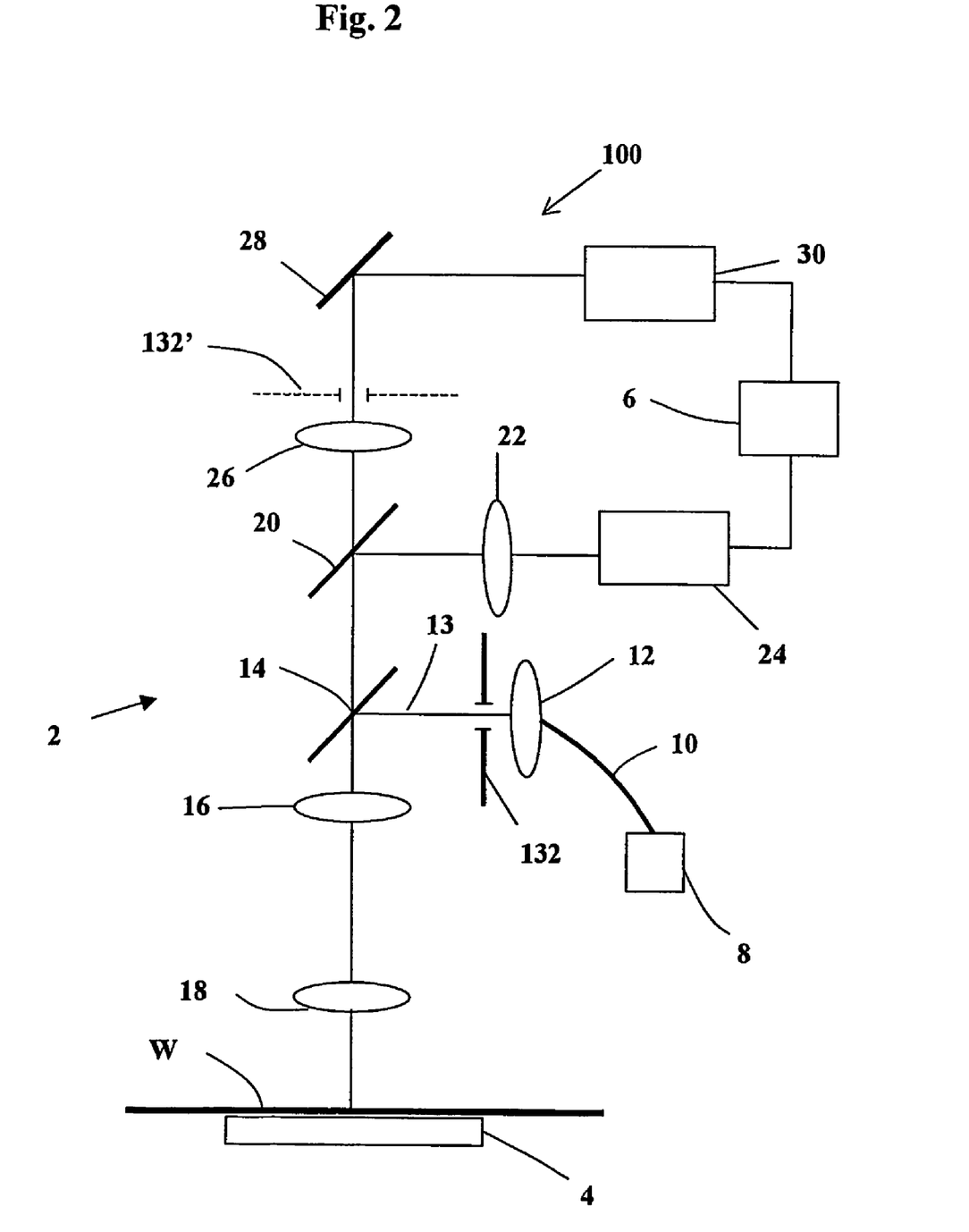
FIG. 2 is a schematic illustration of the main components of a measurement system constructed according to another embodiment of the invention

Reference is made to FIG. 2 illustrating a measurement system 100, constructed and operated according to another embodiment of the invention. To facilitate understanding, same reference numbers are used for identifying those components, which are identical in the system 1. In the system 100, a non-circular (elongated) aperture 132 is positioned in a plane located between a condenser lens 12 and a beam splitter 14 and determines the effective numerical aperture of the illumination assembly. Similarly to the aperture 32 the system of FIG. 1, it determines solid angle of illumination, having different values along two mutually perpendicular axis. Alternatively or in addition, to that configuration, a non-circular (elongated) aperture shown by dashed lines (designated 132') may be positioned in a plane located between a relay lens 26 and a spectrophotometric detector 30.

The operation of the measurement system according to the invention will now be described. Setup of the measurement includes the following two stages:

(1) Definition by the user of a profile model to be used and ranges for each parameter of the selected model. Additionally, knowledge about all the layers in the wafer and their optical properties, and any additional relevant information concerning the product (wafer) to be measured and/or the measurement conditions is desired for defining the measurement sites.

(2) Preparation of a library of spectra (reference data) corresponding to the possible profiles of the grid. The reference data may include set of spectra corresponding to the all or only part of the possible profiles. Each spectrum in the library gives the diffraction efficiency for a given profile of the grating, given polarization, given values numerical aperture of the system, etc. The calculation is made using the known Rigorous Couple Wave Analysis method (RCWT), modal methods, or by a hybrid method containing parts of both previous methods.

In accordance with the present invention, a novelty method and system preferably employs non-circular aperture, providing on the one hand sufficient signal and on the other hand simplifying the interpretation mode by allowing using a minimal number of incidence angles during interpretation. Thus, the calculation time of set up mode may be sufficiently decreased without lose in accuracy. Additionally, in case of using single angle of 0° in calculations, symmetric RCWT may be applied, effecting in accelerating the calculation speed by a factor of 3-5.

The preparation of the library may be made in one or more stages. For example, the following scheme may be used:

(1) Initially, the spectra corresponding to a small number of profiles only are calculated, sparsely sampling the whole multi-dimensional space of possible profiles.

(2) At this point, several measurements are taken and analyzed using the initial library. Average values of the desired parameters are determined, describing an average profile of the wafer.

(3) A sub-space of possible profiles is defined around the average profile. The sub-space is sampled with the required (final) resolution, and the spectra of all profiles in the sub-space are calculated.

(4) The rest of the profile space is divided into sub-spaces with increasing, distance in the parameter space from the average measurement (5) These sub-spaces are consecutively sampled and their corresponding spectra are calculated until the whole parameter space is calculated in the final resolution.

Additionally, in distinction to alternative techniques, in which the system has no independent ability to prepare a library on site, the above scheme advantageously has the issue of handling variations in optical constants. It is well possible that over time, the optical constants of some layers will change slightly. This change could result from lot-to-lot variations due to photoresist properties changes (e.g. composition) or slight changes in process conditions (e.g. temperature, humidity and process time). The chemical producer may disregard such changes since they are not supposed to have any direct effect on the process (e.g. changes in the optical constants of photoresist at wavelengths different than the exposure wavelength). On the other hand, any change in the optical constants of the measured layers will obviously have an effect on the measurement with the system 1. In order to avoid this problem, the system has to monitor on a continuous basis the optical constants of the layers, and, in case when them deviate significantly from the constants used for the calculation of the library, the library has to be rebuilt. If the changes in the optical constants are sufficiently smooth, a system with on-board computational power will be able to follow the changes without a significant deterioration in the measurement accuracy. Obviously, any technique that relies on external computational power will be disadvantageous in the scenario.

Measurement Procedure

Usually, the optical measurements are carried out on predetermined sites on the wafer, each containing a known layer stack, after performing wafer alignment utilizing a so called "alignment feature". In other words, the knowledge of the layers' materials and thicknesses in the stack undergoing measurements, and the location of the alignment feature, are two inherent conditions, constituting the so-called "recipe design", for performing the optical measurements. The preparation of a recipe design associated with a specific article undergoing measurements. The term "recipe design" used herein signifies a computer file containing the full information required to characterize a specific site of the article. The site includes a stack of different layers, which may and may not include different locally adjacent substacks (features of the pattern). The information contained in the recipe design thus includes data indicative of the layers thickness, materials and geometric details (e.g., wafer's features dimensions), optical model(s) to be used for measurements in this site and interpretation data (algorithms), die size, alignment feature location, etc. Additionally, in accordance with the present invention, different effective numerical apertures could be applied in the step of recipe design and this information also included in the recipe design. During the step of recipe design the effective numerical aperture could be adjusted for providing best result (sensitivity to specific profile features, SNR, calculation time, etc.) of measurements. Recipe design may be performed using the same measurement system that is used for actual measurements or any other appropriate tools. The sensitivity/best performance test could be also performed by simulation using appropriate optical models. This recipe design, once prepared, can be used for measuring one or more sites in the article to be measured.

Step 1. Alignment of the wafer W is performed by the wafer handler and wafer stage, so as to provide the correct position and orientation of the wafer W with respect to the measurement system 1. Alignment is controlled by feedback from position and angle sensors typically provided in the measurement system, as well as from the imaging detector 24. The alignment procedure is a very important stage of the entire measurement process, since diffraction efficiency is also a function of the angles between the incidence beam, normal to the wafer's surface and the direction of the grating.

Step 2. The first measurement site is found This is implemented by providing a relative displacement between the objective lens (and possibly other optical elements) and the wafer along two mutually perpendicular axes within a plane parallel to the wafer's surface. For this purpose, feedback from images of some parts of the wafer acquired by the imaging detector 24 can be used.

Figure 5:
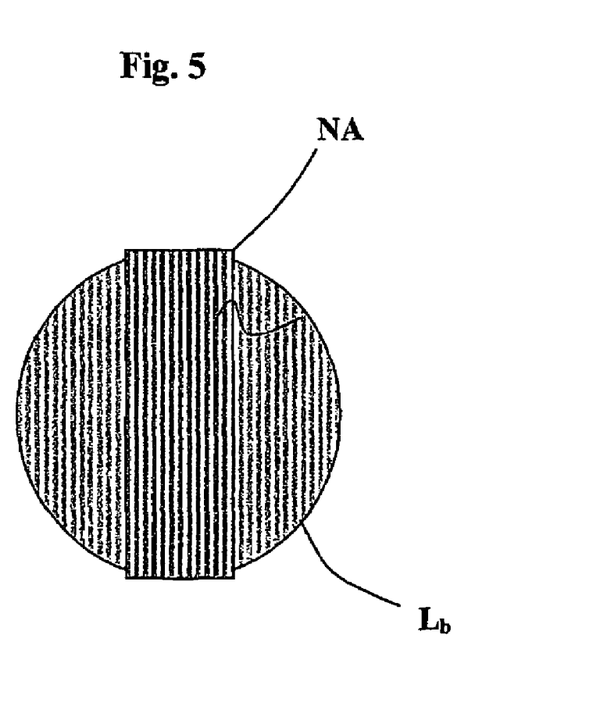
FIG. 5 is a schematic illustration of Numerical Aperture orientation relative to the grid layout.

Step 3. In accordance with the present invention, the wafer W is oriented with respect to the measurement system 1 in such way, that grid lines in the test site are oriented along larger effective numerical aperture, as shown in FIG. 5. Alignment is controlled by feedback from the imaging detector 24 and may be additionally controlled by feedback from spectrophotometric detector 30.

Step 4. Measurement of the reflection efficiency spectra is carried out at the normal incidence with the measurement system 1. These measurements usually are applied to the pre-determined sites S (see above) that include gratings, namely the sites where the measurement spot covers several photoresist regions $L_b$ (FIG. 2). Thus, the measurements can be taken from one or more, grating structures per measured die, where different gratings may have different line/space ratios in order to simulate different conditions of the controlled process.

In accordance with another embodiment of the present invention, the effective numerical aperture with reduced value normally to direction of grating lines could be applied for step of recipe design only. Measurements in accordance with above described step 4 could be performed with symmetric effective numerical aperture, or with effective numerical aperture providing best result (sensitivity to specific profile features, SNR, calculation time, etc.) of measurements. In that case, the effective numerical aperture is adjusted to the value that provides the best measurement throughput for each or selected measurement site S (specific feature).

Simulations performed by the applicant (using TM polarizations) show that spectra are very sensitive to the solid angle of illumination/collection defined by the value of effective numerical aperture having orientation normal to direction of grating lines. Also, it is at least order of magnitude less sensitive to the solid angle of illumination/collection defined by the value of effective numerical aperture having orientation coincide with direction of grating lines. Thus it is possible to reduce the 'effective Numerical Aperture' just by its decreasing or adjusting in the orientation normal to direction of grating lines. Such scheme of adjusting the numerical aperture is much better than simple of reducing the numerical aperture by reducing the radius of the shutter because more light is allowed on the site, thus shortening signal build-up (integration) time and increasing throughput It should be noted that the direction of the slit is directly linked to the direction of the grating. Thus, if grating sites with different orientations are to be measured, the slit needs to be oriented accordingly. The direction of the slit is unrelated to the direction of polarization.

It should also be noted that data indicative of the wafer's profile could be used for adjusting the parameters of an etching tool prior to its application to the measured wafer or the next coming wafer, i.e., for feed-forward purposes. Alternatively or additionally, the measurement system can be used for post-etching measurement.

Those skilled in the art will readily appreciate that various modifications and changes can be applied to the embodiments of the invention as hereinbefore exemplified without departing from its scope defined in and by the appended claims.

The invention claimed is:

1. An optical measurement system for measuring in a structure having a pattern in the form of spaced-apart parallel elongated regions of optical properties different from that of spaces between said regions, the system comprising a broadband illuminator for generating incident radiation, a spectrophotometer arrangement for detecting a spectral response of the structure to the incident radiation, and an optical arrangement for directing the incident light to the structure and collecting the response of the structure, said optical arrangement comprising an elongated aperture stop for mounting with respect to said structure such that providing different values of numerical aperture of at least one of an incident or collected light beams in directions along and perpendicular to longitudinal axes of said elongated regions of the pattern.

2. The system of claim 1 wherein said at least one of said incident or collected light beams being limited by angle not exceeds about 10° in directions perpendicular to longitudinal axes of said elongated regions of the pattern.

3. The system of claim 2 wherein at least one of the incident or collected light beams being limited by angle not exceeds about 20° in direction along the longitudinal axes of said elongated regions of the pattern.

4. The system of claim 1 wherein the value of the numerical aperture does not exceeds about 0.05 in directions perpendicular to longitudinal axes of said elongated regions of the pattern.

5. The system of claim 4, wherein the value of the numerical aperture in direction long the longitudinal axes of said elongated regions of the pattern does not exceed about 0.2.

6. The system of claim 1 wherein said optical arrangement for directing the incident light to the structure and collecting the response of the structure further comprising an objective lens and said elongated aperture stop is located between said objective lens and an image plane.

7. The system of claim 1 wherein said optical arrangement for directing the incident light to the structure and collecting the response of the structure further comprising an objective lens and said elongated aperture stop located in the back focal point of said objective lens or its optically equivalent location.

8. The system of claim 1 wherein said optical arrangement for directing the incident light to the structure and collecting the response of the structure further comprising an illumination condenser and a beam splitter for splitting said incident light and collected response and said elongated aperture stop located between said condenser lens and said beam splitter.

9. The system of claim 1 wherein said optical arrangement for directing the incident light to the structure and collecting the response of the structure further comprising a relay lens located before the spectrophotometer arrangement and said elongated aperture stop located between said relay lens and said spectrophotometer arrangement.

10. The system of claim 1 further comprising imaging utility for determining location and orientation of pattern of interest.

11. The system of claim 1 wherein said elongated aperture stop is adjustable.

12. The system of claim 1 wherein said elongated aperture stop is of slit-like shape.

13. A method for measuring in a structure having a pattern in the form of spaced-apart parallel elongated regions of optical properties different from that of spaces between said regions, the method comprising illuminating the structure with incident radiation and detecting a spectral response of the structure, wherein at least one of incident radiation propagating towards the structure and the radiation response propagating from the structure passes through elongated aperture stop numerical aperture providing different values of numerical aperture of at least one of said incident radiation propagating towards the structure and the radiation response propagating from the structure in directions along and perpendicular to longitudinal axes of said elongated regions of the pattern.

14. The method of claim 13 wherein said at least one of said incident radiation propagating towards the structure and the radiation response propagating from the structure being limited by angle not exceeds about 10° in directions perpendicular to longitudinal axes of said elongated regions of the pattern.

15. The method of claim 14 wherein at least one of the incident radiation propagating towards the structure and radiation response propagating from the structure being limited by angle not exceeds about 20° in directions along the longitudinal axes of said elongated regions of the pattern.

16. The method of claim 13 wherein the value of the numerical aperture does not exceed about 0.05 in directions perpendicular to longitudinal axes of said elongated regions of the pattern.

17. The method of claim 16 wherein the value of the numerical aperture in direction long the longitudinal axes of said elongated regions of the pattern does not exceed about 0.2.

18. The method of claim 13 wherein the orientation of the pattern is determined by applying imaging of said pattern.

19. The method of claim 13 wherein said values of numerical aperture of at least one of said incident radiation propagating towards the structure and the radiation response propagating from the structure in directions long and perpendicular to longitudinal axes of said elongated regions of the pattern being determined by pre-determined value of signal to noise ratio.

20. The method of claim 13 further comprising calculating at least one of optical or geometrical parameters of said pattern and wherein said values of numerical aperture of at least one of said incident radiation propagating towards the structure and the radiation response propagating from the structure in directions along and perpendicular to longitudinal axes of said elongated regions of the pattern being determined by pre-determined value of calculating time.

21. The method of claim 13 wherein said calculating at least one of optical or geometrical parameters of said pattern is performed by applying a RCWT.

22. The method of claim 13 further comprising a step of recipe design including determination of optimal values of numerical aperture of at least one of said incident radiation propagating towards the structure and the radiation response propagating from the structure in directions along and perpendicular to longitudinal axes of said elongated regions of the pattern in specific site of the article.

* * * * *